(12) United States Patent
Wakino et al.

(10) Patent No.: US 10,888,032 B2
(45) Date of Patent: Jan. 5, 2021

(54) APPARATUS FOR LIQUID IMMERSION COOLING, SYSTEM FOR LIQUID IMMERSION COOLING, AND METHOD OF COOLING ELECTRONIC DEVICE

(71) Applicant: FUJITSU LIMITED, Kawasaki-shi, Kanagawa (JP)

(72) Inventors: Yukiko Wakino, Sagamihara (JP); Satoshi Inano, Minoh (JP); Hiroyuki Fukuda, Yokohama (JP); Minoru Ishinabe, Atsugi (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 16/437,847

(22) Filed: Jun. 11, 2019

(65) Prior Publication Data

US 2019/0297747 A1    Sep. 26, 2019

Related U.S. Application Data

(63) Continuation of application No. PCT/JP2018/000121, filed on Jan. 5, 2018.

(30) Foreign Application Priority Data

Jan. 18, 2017  (JP) .................................. 2017-006613

(51) Int. Cl.
*H05K 7/20* (2006.01)
*G06F 1/20* (2006.01)
(Continued)

(52) U.S. Cl.
CPC .......... *H05K 7/20772* (2013.01); *G06F 1/20* (2013.01); *H01L 23/427* (2013.01); *H01L 23/44* (2013.01);
(Continued)

(58) Field of Classification Search
CPC .......... H05K 7/20772; H05K 7/20236; H05K 7/20272; H05K 7/20836; H05K 7/20254;
(Continued)

(56) References Cited

U.S. PATENT DOCUMENTS 5,349,499 A *  9/1994  Yamada ................ H01L 23/427
                                                                361/700
7,092,254 B1 * 8/2006  Monsef ................. H01L 23/473
                                                                361/699
(Continued)

FOREIGN PATENT DOCUMENTS

JP    59-136997    8/1984
JP    6-169039    6/1994
(Continued)

OTHER PUBLICATIONS

"Fluorinert FC-72", Jul. 24, 2014, 3M, Entire Document. (Year: 2014).*

(Continued)

*Primary Examiner* — Stephen S Sul
(74) *Attorney, Agent, or Firm* — Fujitsu Patent Center

(57) ABSTRACT

An apparatus for liquid immersion cooling, the apparatus includes: a casing configured to be partly filled with a first coolant and immerse, in the first coolant, a heat generating component other than a first heat generating component in a plurality of heat generating component; a liquid cooling jacket provided in contact with the first heat generating component placed in the casing, and configured to cool the first heat generating component; a first cooling device configured to dissipate heat of a second coolant sent out from the liquid cooling jacket through a first pipe, thereby cooling the second coolant; and a first pump configured to send out the second coolant cooled by the first cooling device to the liquid cooling jacket through a second pipe.

8 Claims, 10 Drawing Sheets

(51) Int. Cl.
  *H01L 23/44* (2006.01)
  *H01L 23/473* (2006.01)
  *H01L 23/427* (2006.01)
  *H01L 23/10* (2006.01)

(52) U.S. Cl.
  CPC ....... *H01L 23/473* (2013.01); *H05K 7/20236* (2013.01); *H05K 7/20272* (2013.01); *H05K 7/20836* (2013.01); *G06F 2200/201* (2013.01); *H01L 23/10* (2013.01)

(58) Field of Classification Search
  CPC ..... H05K 7/203; G06F 1/20; G06F 2200/201; H01L 23/427; H01L 23/44; H01L 23/473; H01L 23/10; H01L 23/041; H01L 23/46
  USPC .................................... 361/679.47, 698, 702
  See application file for complete search history.

(56) References Cited

U.S. PATENT DOCUMENTS

| | | | | |
|---|---|---|---|---|
| 9,622,379 | B1* | 4/2017 | Campbell | H05K 7/2039 |
| 2007/0025081 | A1* | 2/2007 | Berlin | H01L 23/44 |
| | | | | 361/698 |
| 2009/0260777 | A1* | 10/2009 | Attlesey | G06F 1/20 |
| | | | | 165/67 |
| 2010/0103614 | A1* | 4/2010 | Campbell | H05K 7/203 |
| | | | | 361/689 |
| 2011/0132579 | A1* | 6/2011 | Best | H05K 7/20763 |
| | | | | 165/104.31 |
| 2011/0222237 | A1* | 9/2011 | Fujiwara | G06F 1/203 |
| | | | | 361/679.48 |
| 2011/0315343 | A1* | 12/2011 | Campbell | F28D 15/0233 |
| | | | | 165/80.3 |
| 2012/0236214 | A1* | 9/2012 | Takeguchi | H04N 5/64 |
| | | | | 348/836 |
| 2013/0056179 | A1* | 3/2013 | Wu | F28D 15/0275 |
| | | | | 165/104.26 |
| 2013/0233521 | A1* | 9/2013 | Uchida | F28D 15/0266 |
| | | | | 165/104.26 |
| 2017/0273223 | A1* | 9/2017 | Saito | G06F 1/20 |
| 2018/0027695 | A1 | 1/2018 | Wakino et al. | |
| 2018/0070477 | A1* | 3/2018 | Saito | G06F 1/20 |
| 2018/0092243 | A1* | 3/2018 | Saito | H05K 7/20 |
| 2018/0246550 | A1* | 8/2018 | Inaba | G06F 1/20 |

FOREIGN PATENT DOCUMENTS

| | | |
|---|---|---|
| JP | 9-283677 | 10/1997 |
| JP | 2010-63195 | 3/2010 |
| JP | 2016-46431 | 4/2016 |
| JP | 2018-18857 | 2/2018 |

OTHER PUBLICATIONS

International Search Report and Written Opinion of the International Searching Authority, mailed in connection with PCT/JP2018/000121 and dated Mar. 20, 2018 (15 pages).

* cited by examiner

FIG. 9

| | COMPARATIVE EXAMPLE | EXAMPLE |
|---|---|---|
| CPU MODULE | 2 | 2 |
| HARD DISK | 3 | 3 |
| MEMORY (DIMM) | 4 | 4 |
| POWER SUPPLY UNIT | 2 | 2 |
| RAID CARD | 2 | 2 |
| I/F CARD | 1 | 1 |
| COOLANT INLET | 1 | 1 |
| COOLANT OUTLET | 1 | 1 |
| IMMERSION TANK (CASING) | 1 | 1 |
| WATER COOLING JACKET | 0 | 1 |
| COOLING WATER INLET | 0 | 1 |
| COOLING WATER OUTLET | 0 | 1 |

FIG. 10

|  | COMPARATIVE EXAMPLE | EXAMPLE ||
|---|---|---|---|
|  |  | LIQUID IMMERSION SIDE | WATER COOLING SIDE |
| CALORIFIC VALUE OF CPU (W) | 100 | (NO CPU) | 100 |
| CALORIFIC VALUE OF DIMM (W) | 2.5 | 2.5 | (NO DIMM) |
| CALORIFIC VALUE OF HDD (W) | 5.1 | 5.1 | (NO HDD) |
| COOLANT | INERT COOLANT | INERT COOLANT | WATER |
| FLOW RATE OF COOLANT (L/min) | 2 | 2 | 2 |
| TEMPERATURE OF COOLANT (°C) | 20 | 20 | 15 |

APPARATUS FOR LIQUID IMMERSION COOLING, SYSTEM FOR LIQUID IMMERSION COOLING, AND METHOD OF COOLING ELECTRONIC DEVICE

CROSS-REFERENCE TO RELATED APPLICATION

This application is a continuation application of International Application PCT/JP2018/000121 filed on Jan. 5, 2018 and designated the U.S., the entire contents of which are incorporated herein by reference. The International Application PCT/JP2018/000121 is based upon and claims the benefit of priority of the prior Japanese Patent Application No. 2017-006613, filed on Jan. 18, 2017, the entire contents of which are incorporated herein by reference.

FIELD

Embodiments discussed herein are related to an apparatus for liquid immersion cooling, a system for liquid immersion cooling, and a method of cooling an electronic device.

BACKGROUND

With the advent of the advanced information society, demands for data centers have been increasing more and more. In the data center, a large number of racks are installed in a room, multiple electronic devices such as servers are housed in each of the racks, and all of the electronic devices are collectively managed.

Under these circumstances, the calorific values of electronic devices are increasing with the advancement of the performance of the electronic devices. When electronic devices with high calorific values are mounted at a high density, the temperature of the electronic devices exceeds the allowable upper limit temperature, which may cause a malfunction, a failure, or a decrease in the processing performance. For this reason, there is a demand for cooling methods capable of sufficiently cooling electronic devices with high calorific values even when the electronic devices are mounted at a high density.

As one of the cooling methods, proposed is a method of immersing an electronic device in a liquid coolant to cool the electronic device. Hereinafter, this type of cooling method is referred to as a liquid immersion cooling method. In the liquid immersion cooling method, an inert liquid coolant with high insulating properties (for example, such as a fluorine compound) is put in an immersion tank, an electronic device is immersed in the coolant, and the coolant is circulated between the immersion tank and a heat exchanger (for example, see Japanese Laid-open Patent Publication No. 2016-46431).

In this connection, proposed is a method of cooling by immersing only a component with a high calorific value in an inert liquid coolant with high insulating properties (for example, see Japanese Laid-open Patent Publication No. 59-136997). In addition, also proposed is a method of cooling an electronic component by placing the electronic component in a vessel filled with a coolant, and causing cooling water to flow through thin tubes extending in the vessel (for example, see Japanese Laid-open Patent Publication No. 6-169039).

SUMMARY

According to an aspect of the embodiments, provided is an apparatus for liquid immersion cooling. The apparatus includes: a casing configured to be partly filled with a first coolant and immerse, in the first coolant, a heat generating component other than a first heat generating component in a plurality of heat generating component; a liquid cooling jacket provided in contact with the first heat generating component placed in the casing, and configured to cool the first heat generating component; a first cooling device configured to dissipate heat of a second coolant sent out from the liquid cooling jacket through a first pipe, thereby cooling the second coolant; and a first pump configured to send out the second coolant cooled by the first cooling device to the liquid cooling jacket through a second pipe.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 9 is a diagram specifying component configurations in Comparative Example and Example; and FIG. 10 is a diagram specifying simulation conditions.

DESCRIPTION OF EMBODIMENTS

Besides a central processing unit (CPU), components such as a memory, a power supply unit, and a recording device (storage) also generate an increased calorific value with the recent advancement of the performance of the server. Even though the calorific values of these components are lower than that of the CPU, it is also important to cool these components to enhance the reliability of the server.

According to Japanese Laid-open Patent Publication No. 2016-46431 described above, the entire electronic device is immersed in the coolant. However, when a large number of electronic devices are immersed in the coolant, a large amount of coolant and a place where a large immersion tank is installed are required, which results in high costs. In addition, when a large number of electronic devices are immersed in a large immersion tank, the maintainability of the electronic devices is lowered because it is difficult to take out a particular electronic device (for example, an electronic device having a failure) from the immersion tank.

A technique disclosed herein intends to provide an apparatus for liquid immersion cooling, a system for liquid immersion cooling, and a method of cooling an electronic device, which are capable of sufficiently cooling both of a component with a low calorific value and a component with a high calorific value in a relatively small amount of coolant.

Hereinafter, embodiments are described with reference to the accompanying drawings.

First Embodiment

Figure 1:
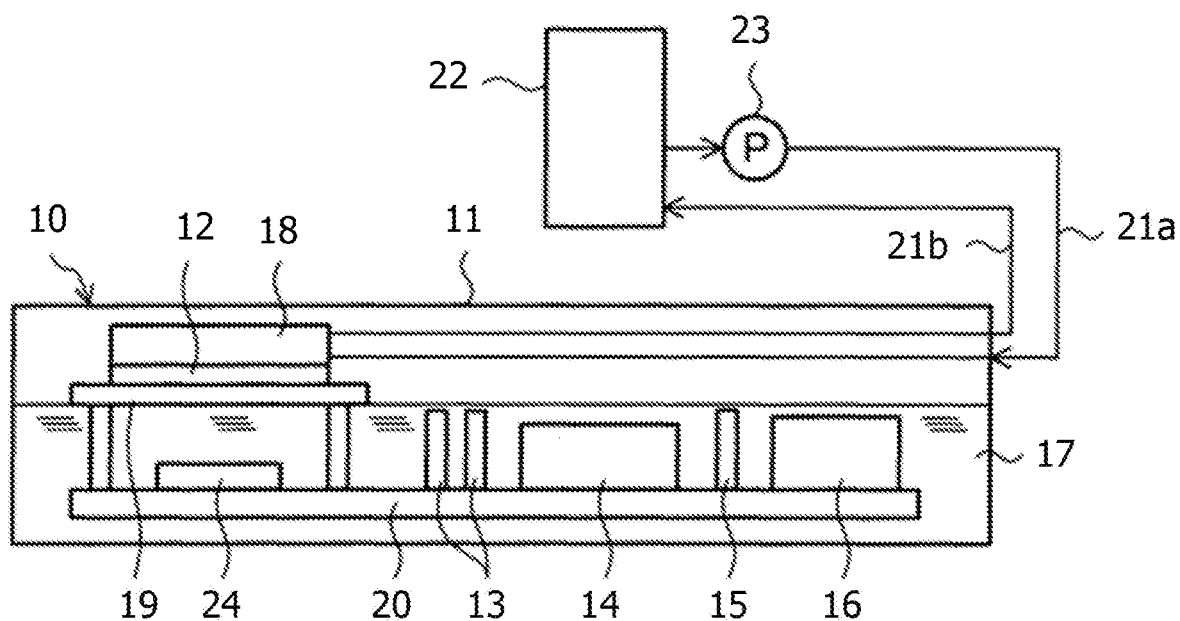
FIG. 1 is a schematic view illustrating an apparatus for liquid immersion cooling and a system for liquid immersion cooling according to a first embodiment.
Figure 2:
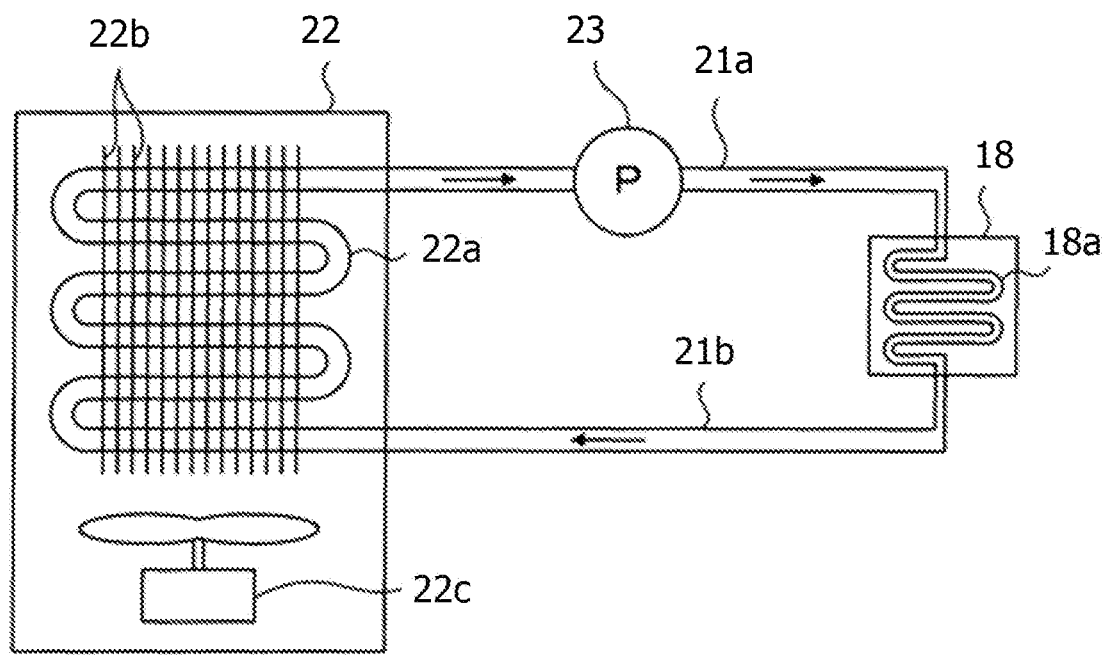
FIG. 2 is a schematic view illustrating a cooling device and a water cooling jacket.

FIG. 1 is a schematic diagram illustrating an apparatus for liquid immersion cooling and a system for liquid immersion cooling according to a first embodiment. FIG. 2 is a schematic diagram illustrating a cooling device and a water cooling jacket. Here, the description is provided for the case where an electronic device is a server.

As illustrated in FIG. 1, an electronic device 10 includes a casing 11 having a hermetic space, and a wiring board 20 placed in the casing 11. A central processing unit (CPU) 12, memories (dual inline memory modules: DIMMs) 13, a hard disk 14, an interface card 15, a power supply unit 16, and so on are connected to the wiring board 20.

An inert liquid coolant 17 with high insulating properties is put in the casing 11. The memories 13, the hard disk 14, the interface card 15, and the power supply unit 16 are immersed in the coolant 17. In contrast, the CPU 12 is mounted on top of the wiring board 20 by using a support table 19, and placed above the liquid surface of the coolant 17. In addition, a stirrer (fan) 24 for stirring the coolant 17 is provided below the CPU 12.

Here, a top lid of the casing 11 is fixed with screws, and is removed by loosening the screws to allow maintenance and other work of the wiring board 20. The stirrer 24 is provided optionally, and may be omitted. The CPU 12 is one example of a first heat generating component, the support table 19 is one example of a support member, and the coolant 17 is one example of a first coolant.

The size and the shape of the electronic device 10 are set to be the same as the size and the shape of a common 1 U server. For this reason, the electronic device 10 may be mounted on a rack for 1 U servers (for example, a 24 U rack, a 32 U rack, a 42 U rack, and so on). The size of the 1 U sever is a height of about 45 mm (1.75 inches=1 U), and a width of about 485 mm (19 inches).

In the present embodiment, a coolant having a boiling point lower than that of water is used as the coolant 17. As such a coolant, there are, for example, fluorine-based inert liquids (Fluorinert (trade mark)) PF-5052 and FC-72 manufactured by 3M Company. The PF-5052 has a boiling point of 50° C., a density of 1700 kg/m$^3$ (25° C.), a specific heat of 1050 J/kgK, and a heat conductivity of 0.062 W/mK. Meanwhile, the FC-72 has a boiling point of 56° C., a density of 1680 kg/m$^3$ (25° C.), a specific heat of 1050 J/kgK, and a heat conductivity of 0.059 W/mK.

A water cooling jacket 18 is attached on top of the CPU 12. The water cooling jacket 18 is a thin-plate shaped member formed of a material with high heat conductivity such as copper or aluminum, and is provided with a flow path 18a through which cooling water flows as illustrated in FIG. 2. A heat conductive sheet (not illustrated) thermally connecting the CPU 12 and the water cooling jacket 18 is provided between the CPU 12 and the water cooling jacket 18.

The water cooling jacket 18 is connected through pipes 21a, 21b to a cooling device 22 arranged outside the casing 11. A pump 23 is provided at a middle of the pipe 21a, and this pump 23 circulates the cooling water between the cooling device 22 and the water cooling jacket 18. The water cooling jacket 18 is one example of a liquid cooling jacket, and the cooling water is one example of a second coolant. Then, the cooling device 22 is one example of a first cooling device.

As illustrated in FIG. 2, the cooling device 22 includes, for example, a zigzagged cooling pipe 22a through which the cooling water flows, a large number of heat radiating fins 22b connected to the cooling pipe 22a, and a fan (air blower) 22c which sends cold air between the fins 22b.

As described later, the cooling water with high temperature heated by the electronic device 10 flows into the cooling device 22. While passing through the cooling pipe 22a, the cooling water is cooled through heat exchange with the air (cold air) which passes between the fins 22b. Then, the cooling water with low temperature is supplied from the cooling device 22 to the electronic device 10.

In the present embodiment, multiple electronic devices 10 are connected to the single cooling device 22, and the single cooling device 22 supplies the cooling water to the multiple electronic devices 10. A commercially available air-cooled or water-cooled chiller (cooling water circulating device) may be used as the cooling device 22.

Figure 3:
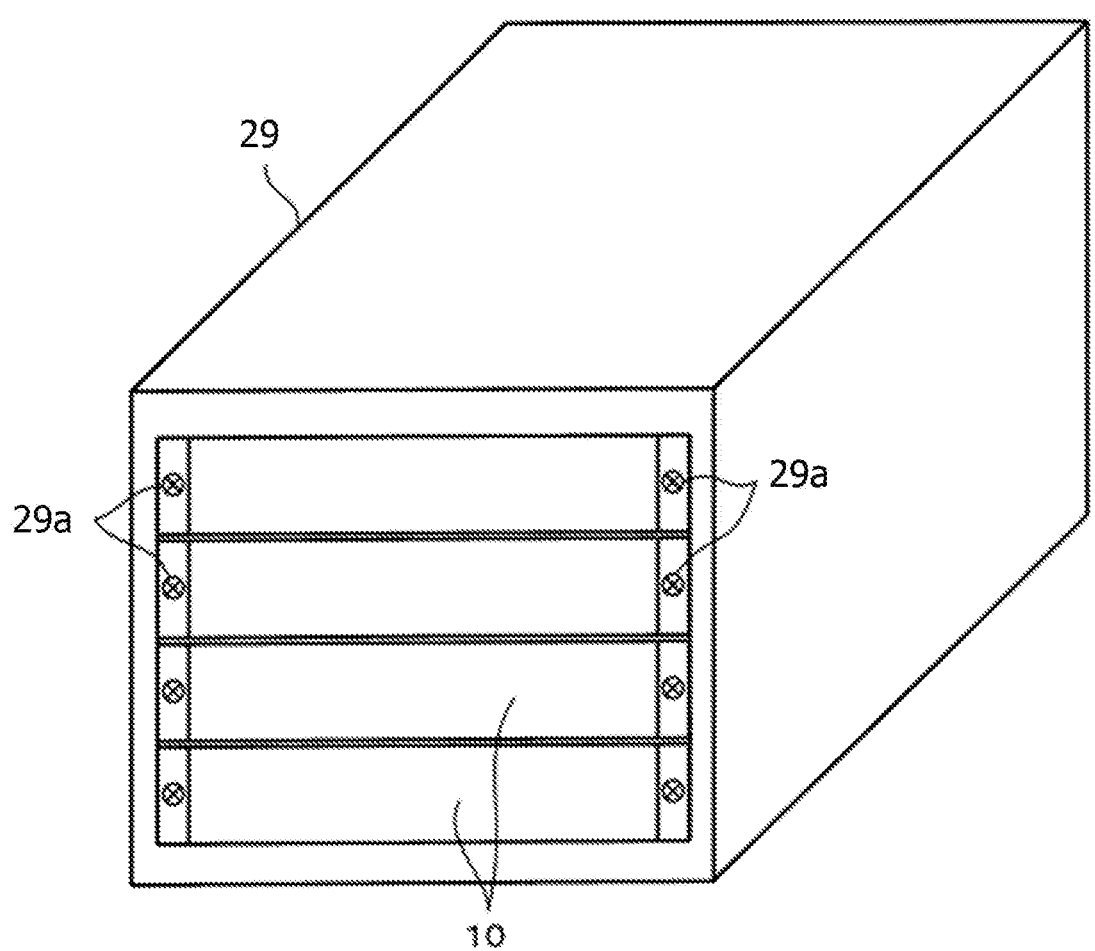
FIG. 3 is a perspective view illustrating a rack in which electronic devices are housed.

FIG. 3 illustrates a rack 29 in which the electronic devices 10 are housed.

As illustrated in FIG. 3, multiple electronic devices 10 (four devices in FIG. 3) are arrayed in a height direction and housed in the rack 29. Each electronic device 10 is connected to the rack 29 with slide rails (not illustrated) interposed in between. At the occasion of maintenance, inspection and other work, each of the electronic devices 10 is easily pulled out of the rack 29 by sliding the slide rails. In FIG. 3, reference sign 29a indicates fixtures (screws) for fixing the electronic devices 10 to the rack 29.

When the electronic devices 10 are housed in the rack 29, the electronic devices 10 are electrically connected through connectors (not illustrated) to wiring (such as a LAN cable) installed inside the rack 29.

Here, FIG. 3 illustrates a small rack (4 U rack for housing four electronic devices 10 in 1 U size). However, the electronic devices 10 of the present embodiment may be mounted in any rack for 1 U servers as described above. For example, in the case of using a 32 U rack, at most 32 electronic devices 10 may be mounted in a vertical direction in the rack.

Figure 4:
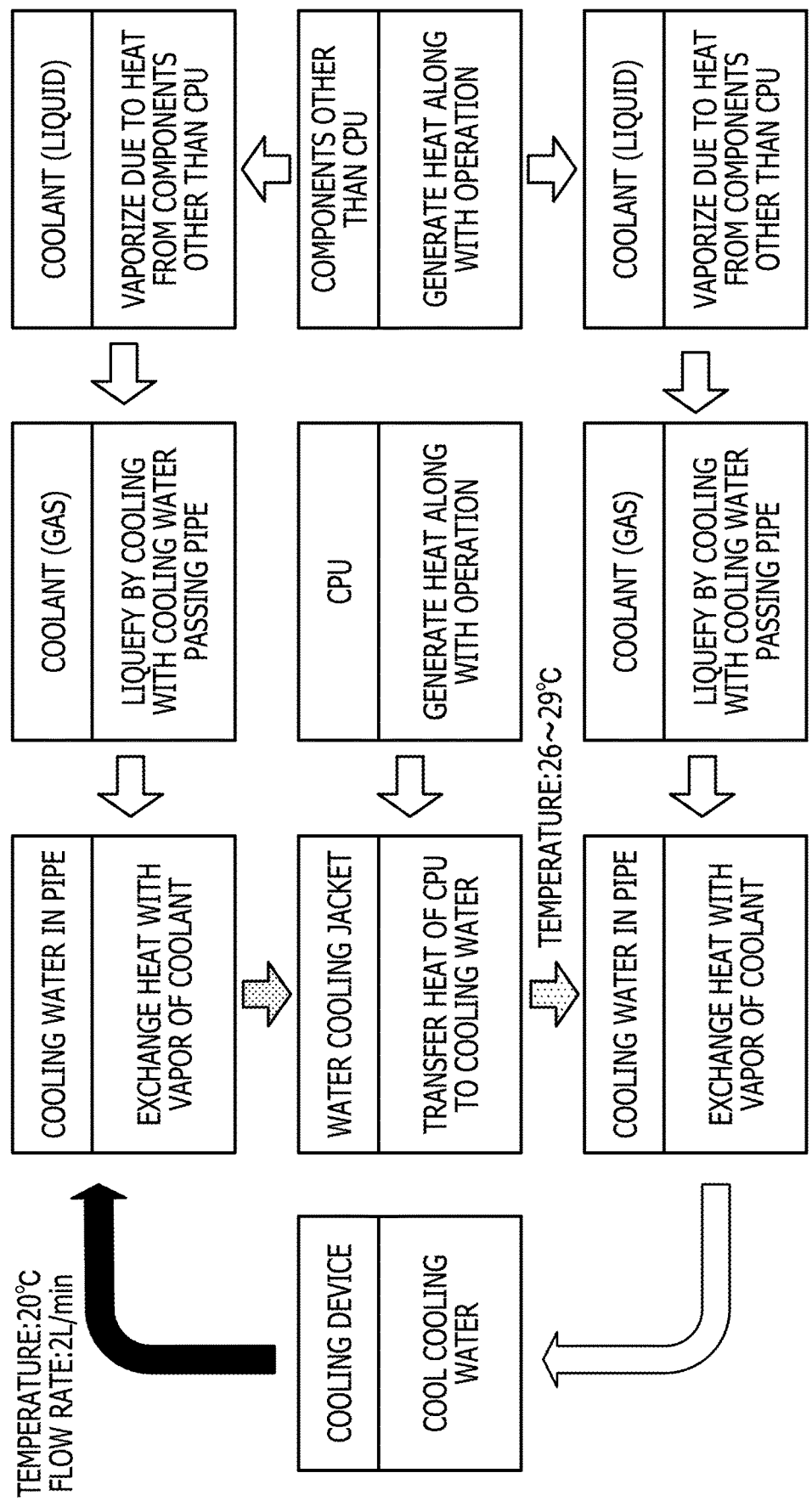
FIG. 4 is a diagram presenting transfer of heat in the system for liquid immersion cooling according to the first embodiment.

Hereinafter, an operation of the system for liquid immersion cooling according to the present embodiment is described with reference to FIGS. 1 and 4. FIG. 4 presents transfer of heat. In the present embodiment, cooling water at normal temperature (20° C.) is supplied at a flow rate of 2 litters (L)/min from the cooling device 22 to the electronic device 10.

Along with the operation of the electronic device 10, the CPU 12, the memories 13, the hard disk 14, the interface card 15, the power supply unit 16, and so on generate heat. The CPU 12 generates a large amount of heat, whereas the memories 13, the hard disk 14, the interface card 15, the power supply unit 16, and so on generate a relatively small amount of heat. Hereinafter, the components such as the memories 13, the hard disk 14, the interface card 15, and the power supply unit 16 immersed in the liquid coolant 17 are collectively referred to as "components such as the memories 13" for the sake of convenience of description.

The heat generated by the CPU 12 is transferred to the water cooling jacket 18, and is further transferred to the cooling water passing the inside of the water cooling jacket 18. The heat generated by the CPU 12 is transferred to the cooling water through the water cooling jacket 18, and thereby the temperature of the CPU 12 is kept at or below the allowable upper limit temperature of the CPU 12.

The temperature of the cooling water passing the inside of the water cooling jacket 18 rises due to the heat transferred from the CPU 12. Here, the temperature of the cooling water discharged from the water cooling jacket 18 is 26° C. to 29° C.

On the other hand, the heat generated by the components such as the memories 13 is transferred to the coolant 17 around the components such as the memories 13. Due to the transfer of the heat to the coolant 17, an excessive temperature rise in the components such as the memories 13 is avoided while the temperature of the coolant 17 rises.

When the temperature of the coolant 17 rises, the coolant 17 turns easily vaporizable. When the liquid coolant 17 vaporizes to a gas, the coolant 17 absorbs heat of vaporization from the surroundings. Then, the gaseous coolant 17 moves to the space above the liquid surface. For this reason, the space above the liquid surface in the casing 11 is filled with the vapor of the coolant 17.

Note that air bubbles of the coolant 17, if attached to the components such as the memories 13, may hinder the transfer of the heat from the components such as the memories 13 to the liquid coolant 17. However, in the present embodiment, the stirrer 24 stirs the liquid coolant 17, which reduces the attachment of the air bubbles to the components such as the memories 13.

Cooling water having temperature (for example, 20° C. to 29° C.) lower than the boiling point of the coolant 17 flows in the pipes 21a, 21b. Due to the cooling water, the vapor of the coolant 17 near the pipes 21a, 21b is cooled and condensed to a liquid. In this process, the coolant 17 releases heat of condensation to raise the temperature of the cooling water passing the inside of the pipes 21a, 21b. The temperature rise of the cooling water due to the heat of condensation of the coolant 17 is about several degrees, although it depends on the flow rate of the cooling water passing the inside of the pipes 21a, 21b. The pipes 21a, 21b may be provided with fins for absorbing the heat in order to promote the condensation of the coolant 17.

The coolant 17 having tuned to the liquid attaches to the pipes 21a, 21b, and then drops by the gravity after forming a mass large to a certain extent.

In the present embodiment, the heat generated by the CPU 12 (the component with a high calorific value) is transferred to the water cooling jacket 18 and is transported from the water cooling jacket 18 to the cooling device 22 via the cooling water as described above. On the other hand, the heat generated by the components such as the memories 13 (the components with low calorific values) is transferred to the pipes 21a, 21b through the coolant 17 which undergoes changes between the liquid phase and the gaseous phase, and is further transported to the cooling device 22 via the cooling water passing the inside of the pipes 21a, 21b. Then, the cooling device 22 releases the heat transported via the cooling water to the atmosphere.

As a result, in the present embodiment, it is possible to sufficiently cool the components with low calorific values as well, in addition to the component with a high calorific value.

In the present embodiment, the amount of the coolant 17 required to cool a single electronic device 10 is smaller than the volume of the electronic device 10. Thus, the amount of the coolant used is smaller in the present embodiment than in the method of the related art in which the entire electronic devices are immersed and cooled in the coolant. Moreover, the electronic device 10 has the same size and shape as the common 1 U server. Thus, when a 32 U rack is used, for example, at most 32 electronic devices 10 may be mounted in the height direction in the rack. Therefore, the present embodiment only uses a small installation floor area per electronic device.

For these reasons, the present embodiment enables significant reduction of costs for constructing a system for liquid immersion cooling as compared with the method of the related art in which the entire electronic devices are immersed inside the coolant in the immersion tank.

Further, the electronic devices 10 may be mounted in the common rack for 1 U servers as described above. Thus, when a particular electronic device (for example, an electronic device having a failure) may be easily taken out from the rack. This leads to the good maintainability of the electronic devices 10.

Second Embodiment

Figure 5:
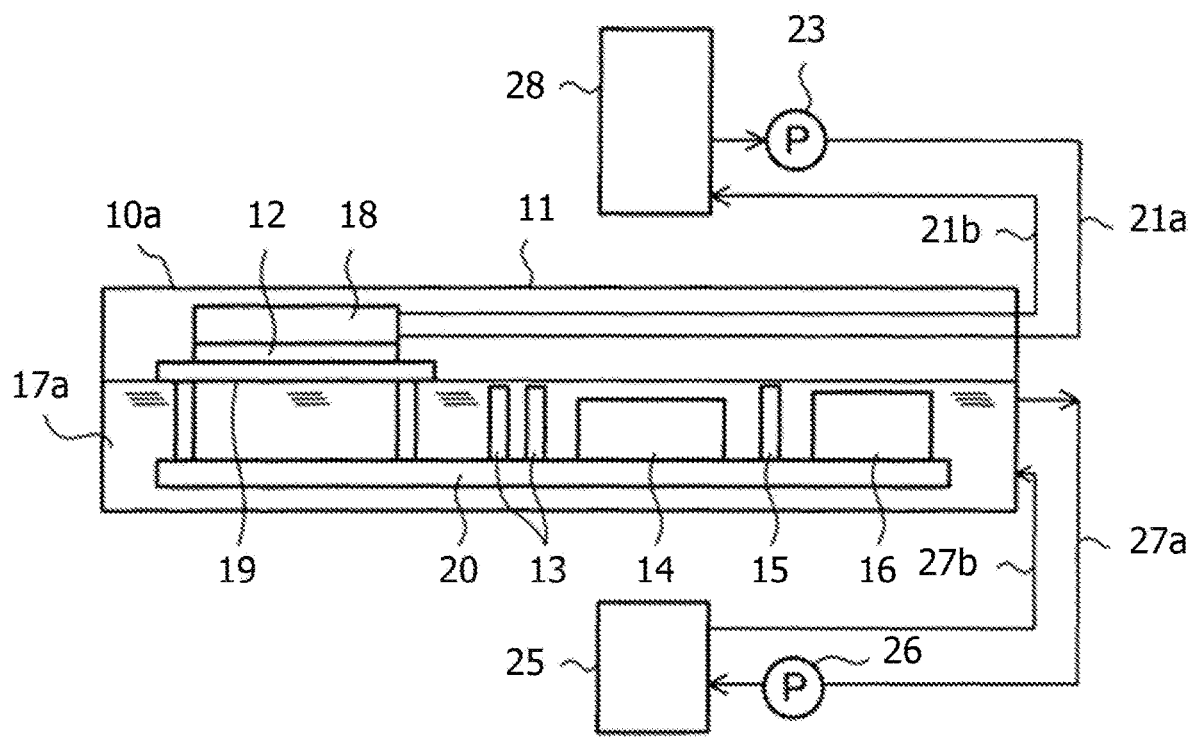
FIG. 5 is a schematic view illustrating a system for liquid immersion cooling according to a second embodiment.

FIG. 5 is a schematic diagram illustrating a system for liquid immersion cooling according to a second embodiment. In FIG. 5, the same elements as those in FIG. 1 are illustrated with the same reference signs.

Also in the present embodiment, an electronic device 10a includes a casing 11 having a hermetic space, and a wiring board 20 placed in the casing 11. The wiring board 20 is mounted with a CPU 12, memories 13, a hard disk 14, an interface card 15, a power supply unit 16, and so on.

An inert liquid coolant 17a with high insulating properties is put in the casing 11. The memories 13, the hard disk 14, the interface card 15, and the power supply unit 16 are immersed in the coolant 17a.

As in the first embodiment, the CPU 12 is mounted on top of the wiring board 20 by using a support table 19, and placed above the liquid surface of the coolant 17a. In addition, a water cooling jacket 18 is attached on top of the CPU 12. The size and the shape of the electronic device 10a are set to be the same as the size and the shape of a common 1 U server.

In the present embodiment, a coolant which tends not to vaporize is used as the coolant 17a. As such a coolant, for example, Fluorinert (trade mark) FC-40 or FC-43 manufactured by 3M Company may be used. The FC-40 has a boiling point of 155° C., a density of 1870 kg/m³ (25° C.), a specific heat of 1050 J/kgK, and a heat conductivity of 0.067 W/mK. Meanwhile, the FC-43 has a boiling point of 174° C., a density of 1880 kg/m³ (25° C.), a specific heat of 1050 J/kgK, and a heat conductivity of 0.067 W/mK.

The water cooling jacket 18 is connected through pipes 21a, 21b to a cooling device 28 arranged outside the casing 11. A pump 23 is provided at a middle of the pipe 21a, and this pump 23 circulates the cooling water between the cooling device 28 and the water cooling jacket 18.

In the present embodiment, an air-cooled or water-cooled chiller is used as the cooling device 28. Cooling water having temperature of 15° C., for example, is supplied from the cooling device 28 to the electronic device 10a. The cooling water is one example of a second coolant, and the cooling device 28 is one example of the first cooling device.

In addition, a cooling device 25 is arranged outside the casing 11. Pipes 27a, 27b are connected to the cooling device 25 and the casing 11 of the electronic device 10a. For example, the cooling device 25 has the same structure as the cooling device 22 in the first embodiment (see FIG. 2). Specifically, the cooling device 25 includes a cooling pipe through which the coolant 17a flows, a large number of heat radiating fins connected to the cooling pipe, and a fan (air blower) which sends cold air between the fins.

A pump 26 is provided at a middle of the pipe 27a, and this pump 26 circulates the coolant 17a between the casing 11 and the cooling device 25. As described later, the coolant 17a having high temperature inside the casing 11 is transported to the cooling device 25 by the pump 26, and the coolant 17a in the cooling device 25 exchanges the heat with the outside air. Then, the coolant 17a having low temperature (for example, 20° C.) is supplied from the cooling device 25 to the inside of the casing 11. The coolant 17a is one example of the first coolant, and the cooling device 25 is one example of a second cooling device.

Figure 6:
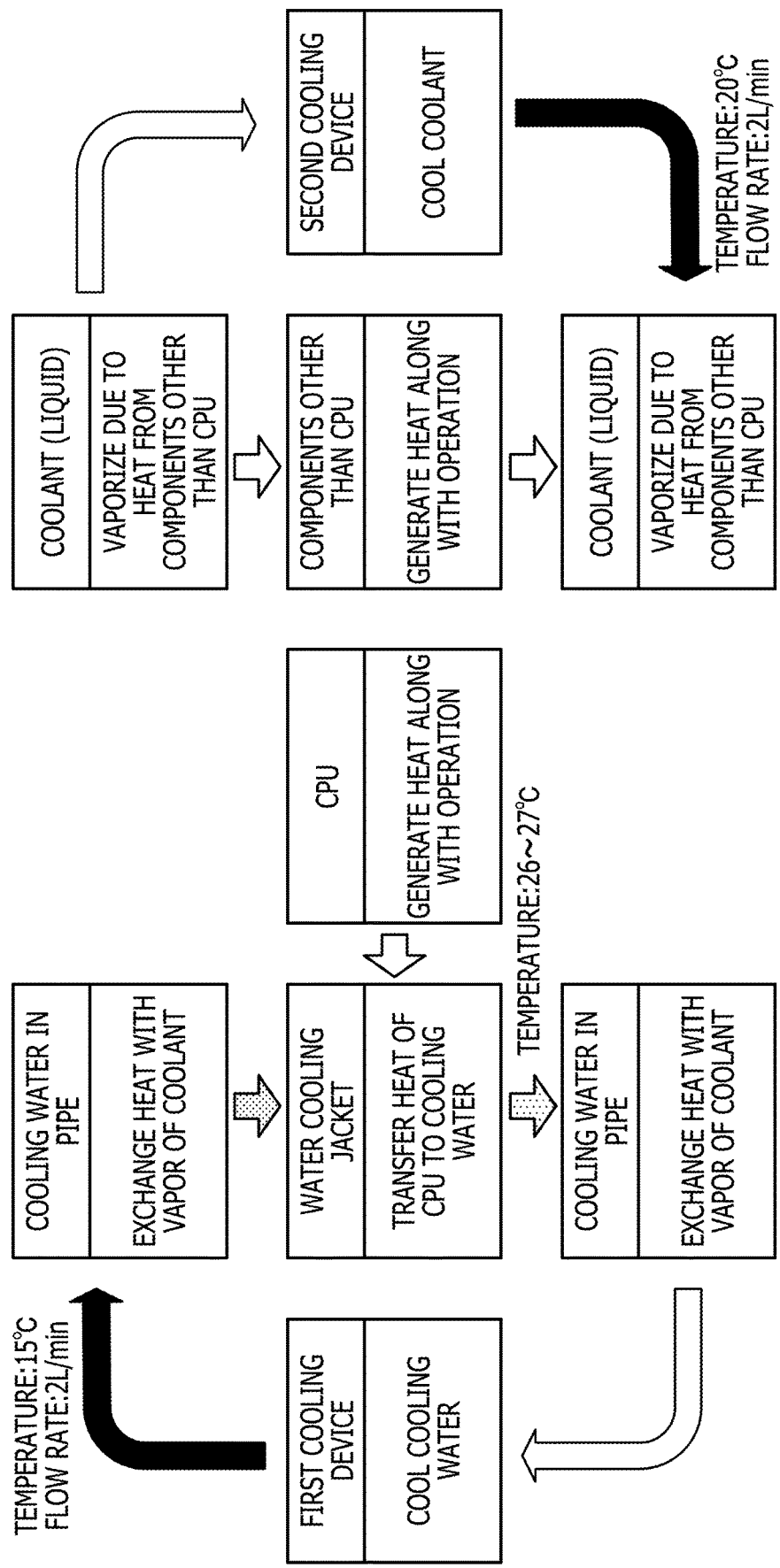
FIG. 6 is a diagram presenting transfer of heat in the system for liquid immersion cooling according to the second embodiment.

Hereinafter, an operation of the system for liquid immersion cooling according to the present embodiment is described with reference to FIGS. 5 and 6. FIG. 6 presents transfer of heat.

In the present embodiment, the cooling water at temperature of 15° C. is supplied at a flow rate of 2 litters (L)/min from the cooling device 28 to the electronic devices 10a. In addition, the coolant 17a at temperature of 20° C. is supplied at a flow rate of 2 litters (L)/min from the cooling device 25 to the electronic devices 10a.

Along with the operation of each electronic device 10a, the CPU 12 and the components such as the memories 13 generate heat. The heat generated by the CPU 12 is transferred to the water cooling jacket 18, and is further transferred to the cooling water passing the inside of the water cooling jacket 18. The heat generated by the CPU 12 is transferred to the cooling water through the water cooling jacket 18, and thereby the temperature of the CPU 12 is kept at or below the allowable upper limit temperature of the CPU 12.

The temperature of the cooling water passing the inside of the water cooling jacket 18 rises due to the heat transferred from the CPU 12. Here, the temperature of the cooling water discharged from the water cooling jacket 18 is 26° C. to 27° C. This cooling water at high temperature is transported to the cooling device 28, is cooled in the cooling device 28, and then is sent to the water cooling jacket 18.

On the other hand, the heat generated by the components such as the memories 13 is transferred to the coolant 17a around the components such as the memories 13. The transfer of the heat to the coolant 17a leads to an avoidance of an excessive temperature rise in the components such as the memories 13 and raises the temperature of the coolant 17a.

The coolant 17a at high temperature in the casing 11 is sent to the cooling device 25 by the pump 26, and the coolant 17a in the cooling device 25 exchanges the heat with the outside air to decrease in temperature. Then, the coolant 17a at low temperature is supplied from the cooling device 25 to the electronic devices 10a.

Also in the present embodiment, the CPU 12 (the component with a high calorific value) is cooled by the cooling water passing the inside of the water cooling jacket 18, while the components such as the memories 13 (the components with low calorific values) are immersed and cooled in the coolant 17a. Then, the amount of the coolant 17a required to cool the single electronic device 10a is smaller than the volume of the electronic device 10a.

Thus, the present embodiment only uses a smaller amount of the coolant per electronic device than the method of the related art in which the entire electronic device is immersed and cooled in the coolant.

Moreover, the electronic device 10a has the same size and shape as the common 1 U server. Thus, a large number of electronic devices 10a may be arrayed in the height direction and housed in the rack. Therefore, the installation floor area per electronic device is smaller than that in the method of the related art in which the entire electronic devices are immersed.

According to the present embodiment, these advantages lead to a significant reduction in costs for constructing a system for liquid immersion cooling. Moreover, since the electronic devices 10a may be mounted on the common rack for 1 U servers, the maintainability is good.

Hereinafter, description is provided for a result of simulation of cooling performance of the present embodiment in comparison with Comparative Example.

Figure 7:
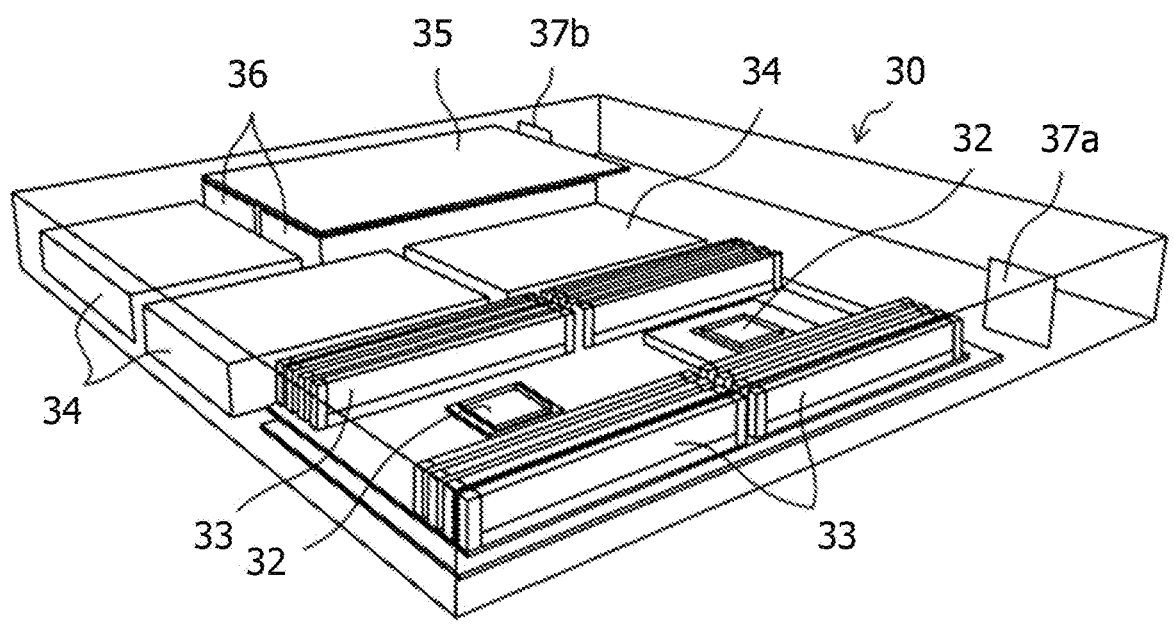
FIG. 7 is a perspective view of an electronic device in Comparative Example.
Figure 8:
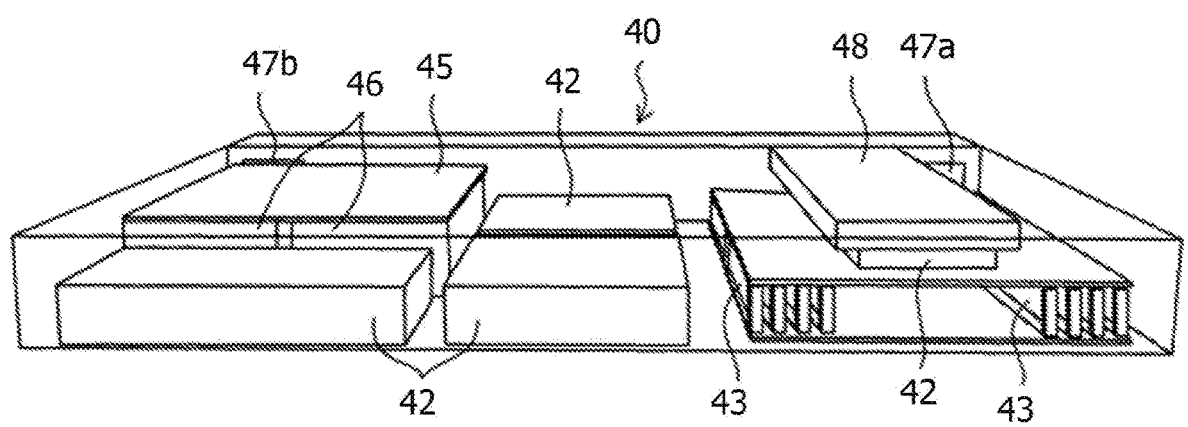
FIG. 8 is a perspective view of an electronic device in Example.

FIG. 7 is a perspective view of an electronic device in Comparative Example, and FIG. 8 is a perspective view of an electronic device in Example. In addition, FIG. 9 is a diagram specifying component configurations in Comparative Example and Example. Moreover, FIG. 10 is a diagram specifying simulation conditions and presenting the calorific values of the CPU, the memories, and the hard disk, and the type, flow rate, and temperature of the coolant.

As illustrated in FIG. 7, an electronic device 30 in Comparative Example includes two CPUs (CPU modules) 32, three hard disks (HDDs) 34, four memories (DIMMs) 33, two power supply units 36, an interface card (I/F card) 35, and two RAID cards (not illustrated).

An inert coolant (fluorine compound) is filled in the electronic device 30, and all of the CPUs 32, the hard disks 34, the memories 33, the power supply units 36, the interface card 35, and the RAID cards are immersed in the coolant.

Then, the electronic device 30 is connected to an external cooling device through a pipe, and the coolant is circulated between the electronic device 30 and the cooling device. In FIG. 7, reference sign 37a indicates a coolant inlet and reference sign 37b indicates a coolant outlet.

The size of the electronic device 30 in Comparative Example is a width W of 484 mm, a length L of 380 mm, and a height H of 45 mm.

On the other hand, as illustrated in FIG. 8, the electronic device 40 in Example includes two CPUs (CPU modules) 42, three hard disks (HDDs) 44, four memories (DIMMs) 43, two power supply units 46, an interface card (I/F card) 45, and two RAID cards (not illustrated).

An inert coolant (fluorine compound) is filled in the electronic device 40, and all of the hard disks 44, the memories 43, the power supply units 46, the interface card 45, and the RAID cards are immersed in the coolant. Note that the CPUs 42 are placed above the liquid surface of the coolant. Then, a water cooling jacket 48 is mounted on top of the CPUs 42.

The water cooling jacket 48 is connected to an external first cooling device through a pipe, and cooling water is circulated between the first cooling device and the water cooling jacket 48.

Meanwhile, the electronic device 40 is connected to an external second cooling device through a pipe, and the coolant is circulated between the electronic device 40 and the second cooling device. In FIG. 8, reference sign 47a indicates a coolant inlet and reference sign 47b indicates a coolant outlet.

The size of the electronic device 40 in Example is a width W of 484 mm, a length L of 470 mm, and a height H of 45 mm. The length L of the electronic device 40 in Example is longer than the length L of the electronic device 30 in Comparative Example, because the electronic device 40 requires a space where to place a pipe though which the cooling water flows.

Simulation was carried out in terms of the temperature around the CPUs 32 of the electronic device 30 in Comparative Example and the temperature around the CPUs 42 of the electronic device 40 in Example under the above conditions and the conditions specified in FIGS. 9 and 10. As a result of this, the temperature around the CPUs 32 of the electronic device 30 in Comparative Example was 192° C., whereas the temperature around the CPUs 42 of the electronic device 40 in Example was about 26° C. to 27° C.

This simulation result validated that the electronic device 40 in Example was capable of sufficiently cooling the CPUs 42.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An apparatus for liquid immersion cooling, the apparatus comprising:
    a casing configured to be partly filled with a first coolant and immerse, in the first coolant, a heat generating component other than a first heat generating component in a plurality of heat generating components;
    a liquid cooling jacket provided in contact with the first heat generating component placed in the casing, and configured to cool the first heat generating component;
    a first cooling device configured to dissipate heat of a second coolant sent out from the liquid cooling jacket through a first pipe, thereby cooling the second coolant;
    a first pump configured to send out the second coolant cooled by the first cooling device to the liquid cooling jacket through a second pipe; and
    a support member arranged in the casing and configured to support the first heat generating component to keep the first heat generating component from being immersed in the first coolant.

2. The apparatus according to claim 1, further comprising:
    a second cooling device configured to exchange heat with the first coolant sent out from inside of the casing through a third pipe, thereby cooling the first coolant, and
    a second pump configured to send out the first coolant cooled by the second cooling device to the inside of the casing through a fourth pipe.

3. The apparatus according to claim 1, further comprising:
    a fan arranged in the casing and configured to stir the first coolant.

4. The apparatus according to claim 1, wherein the first coolant has a lower boiling point than the second coolant has.

5. The apparatus according to claim 1, wherein the first heat generating component has a highest calorific value of the plurality of heat generating components.

6. The apparatus according to claim 5, wherein the first heat generating component is an arithmetic processing apparatus.

7. A system for liquid immersion cooling, the system comprising:
    a plurality of heat generating components; and
    an apparatus for liquid immersion cooling configured to cool the electronic device,
    wherein the apparatus for liquid immersion cooling includes
    a casing configured to be partly filled with a first coolant and immerse, in the first coolant, a heat generating component other than a first heat generating component in the plurality of heat generating components,
    a liquid cooling jacket provided in contact with the first heat generating component placed in the casing, and configured to cool the first heat generating component,
    a first cooling device configured to dissipate heat of a second coolant sent out from the liquid cooling jacket through a first pipe, thereby cooling the second coolant,
    a first pump configured to send out the second coolant cooled by the first cooling device to the liquid cooling jacket through a second pipe, and
    a support member arranged in the casing and configured to support the first heat generating component to keep the first heat generating component from being immersed in the first coolant.

8. A method of cooling a plurality of heat generating components by using an apparatus for liquid immersion cooling including a casing configured to be partly filled with a first coolant and immerse, in the first coolant, a heat generating component other than a first heat generating component in the plurality of heat generating components, the method comprising:
    cooling the first heat generating component with a liquid cooling jacket which is included in the apparatus for liquid immersion cooling, and which is placed in contact with the first heat generating component placed inside the casing;
    cooling a second coolant with a cooling device included in the apparatus for liquid immersion cooling, by dissipating heat of the second coolant sent out from the liquid cooling jacket through a first pipe; and
    sending out the second coolant cooled by the cooling device to the liquid cooling jacket through a second pipe by a pump included in the apparatus for liquid immersion cooling; and
    supporting the first heat generating component by a support member to keep the first heat generating component from being immersed in the first coolant.

* * * * *